United States Patent
Lee et al.

(10) Patent No.: US 10,026,771 B1
(45) Date of Patent: Jul. 17, 2018

(54) IMAGE SENSOR WITH A CROSS-WAFER CAPACITOR

(71) Applicant: Apple Inc., Cupertino, CA (US)

(72) Inventors: Chiajen Lee, Cupertino, CA (US);
Xiaofeng Fan, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/611,917

(22) Filed: Feb. 2, 2015

Related U.S. Application Data (60) Provisional application No. 62/057,863, filed on Sep. 30, 2014.

(51) Int. Cl.
H01L 21/00 (2006.01)
H01L 27/146 (2006.01)

(52) U.S. Cl.
CPC .... *H01L 27/1464* (2013.01); *H01L 27/14636* (2013.01)

(58) Field of Classification Search
CPC .......... H01L 27/1464; H01L 27/14636; H01L 23/642
See application file for complete search history.

(56) References Cited

U.S. PATENT DOCUMENTS

| | | | |
|---|---|---|---|
| 7,349,574 B1 | 3/2008 | Sodini et al. | |
| 8,111,306 B2 | 2/2012 | Kuruma et al. | |
| 8,128,890 B2 | 5/2012 | Droog | |
| 8,792,020 B2 | 7/2014 | Lee et al. | |
| 2005/0002448 A1* | 1/2005 | Knight | G01R 31/3025 333/24 C |
| 2008/0054320 A1 | 3/2008 | Solhusvik et al. | |
| 2012/0262408 A1 | 10/2012 | Pasquero et al. | |
| 2014/0042299 A1* | 2/2014 | Wan | H01L 27/14609 250/208.1 |
| 2015/0115386 A1* | 4/2015 | Chuang | H01L 27/14603 257/443 |
| 2015/0349005 A1* | 12/2015 | Yamashita | H01L 27/14605 257/292 |
| 2017/0316248 A1 | 11/2017 | Yi et al. | |

FOREIGN PATENT DOCUMENTS

WO WO 15/005959 1/2015

OTHER PUBLICATIONS

B. Charlet, L. Di Cioccio, J. Dechamp, M. Zussy, T. Enot, R. Canegallo, A. Fazzi, R. Guerrieri, L. Magagni, "Chip-to-chip interconnections based on the wireless capacitive coupling for 3D integration" Microelectronic Engineering, vol. 83, Issues 11-12, Nov.-Dec. 2006, pp. 2195-2199.*

* cited by examiner

*Primary Examiner* — Lex Malsawma
*Assistant Examiner* — Laura Dykes
(74) *Attorney, Agent, or Firm* — Brownstein Hyatt Farber Schreck, LLP (57) ABSTRACT

One or more cross-wafer capacitors are formed in an electronic component, circuit, or device that includes stacked wafers. One example of such a device is a stacked image sensor. The image sensor can include two or more wafers, with two wafers that are bonded to each other each including a conductive segment adjacent to, proximate, or abutting a bonding surface of the respective wafer. The conductive segments are positioned relative to each other such that each conductive element forms a plate of a capacitor. A cross-wafer capacitor is formed when the two wafers are attached to each other.

8 Claims, 9 Drawing Sheets

IMAGE SENSOR WITH A CROSS-WAFER CAPACITOR

CROSS-REFERENCE TO RELATED APPLICATION

This application claims the benefit under 35 U.S.C. § 119(e) of U.S. Provisional Patent Application No. 62/057,863, filed Sep. 30, 2014, entitled "Image Sensor with a Cross-Wafer Capacitor," the entirety of which is incorporated herein by reference.

TECHNICAL FIELD

The present invention relates generally to integrated devices or circuits that are constructed with two or more stacked semiconductor wafers or dies. More particularly, the present invention relates to a cross-wafer capacitor in an integrated device, such as in an image sensor.

BACKGROUND

Cameras and other image recording devices often use one or more image sensors, such as a charge-coupled device (CCD) image sensor or a complementary metal-oxide-semiconductor (CMOS) image sensor to capture an image. Image sensors, such as CMOS image sensors, can be implemented as vertically stacked image sensors. A vertically stacked image sensor bonds two or more separate wafers together to form the image sensor. One wafer can be an imaging wafer that includes the pixel array, while another wafer may be a circuit wafer that includes circuitry to read the charge or signals out of the pixel array. In some situations, it may be desirable to include one or more additional electrical components in an image sensor.

SUMMARY

Embodiments described herein include additional circuits or electrical components in an electronic device or component having vertically stacked wafers. One example of such a device is a stacked image sensor. In one aspect, an image sensor includes a first wafer having a first conductive segment disposed at or near a bonding surface of the first wafer, and a second wafer attached to the bonding surface of the first wafer. The second wafer includes a second conductive element disposed at or near a bonding surface of the second wafer and positioned at a location that corresponds to the location of the first conductive segment in the first wafer. Together the first and second conductive segments form at least one cross-wafer capacitor.

In another aspect, an image sensor includes a back-illuminated image sensor formed in two or more vertically stacked wafers. A first conductive segment disposed at or near a bonding surface of a first wafer. A second wafer is attached to the bonding surface of the first wafer. The second wafer includes a second conductive element disposed at or near a bonding surface of the second wafer and positioned at a location that corresponds to the location of the first conductive segment in the first wafer. The combined first and second conductive segments form at least one cross-wafer capacitor in the back-illuminated image sensor.

In yet another aspect, an integrated device, such as an image sensor, includes a first wafer having two or more conductive segments (e.g., a first conductive segment, a second conductive segment, and a third conductive segment) each disposed at or near a bonding surface of the first wafer. A second wafer is attached to the bonding surface of the first wafer. The second wafer includes two or more conductive segments (e.g., a fourth conductive segment, a fifth conductive segment, and a sixth conductive segment). Each of the fourth, fifth, and sixth conductive segment is disposed at or near a bonding surface of the second wafer. The first, second, and third conductive segments are positioned at locations that correspond to the locations of the fourth, fifth, and sixth conductive segment in the first wafer, respectively. The first and fourth conductive segments form a first cross-wafer capacitor. The second and fifth conductive segments form a second cross-wafer capacitor. And the third and sixth conductive segments form a third cross-wafer capacitor.

In some embodiments, the cross-wafer capacitor formed by the second and fifth conductive segments may be an intermediate cross-wafer capacitor, in that the capacitor is positioned between the other two cross-wafer capacitors. The second and fifth conductive segments can both be connected to ground. In this manner, the intermediate cross-wafer capacitor may isolate the adjacent cross-wafer capacitors and reduce or prevent cross-capacitance from developing between the adjacent cross-wafer capacitors.

In another aspect, an integrated device, such as an image sensor, includes a first wafer having a first conductive segment disposed at or near a bonding surface of the first wafer. A second wafer is attached to the bonding surface of the first wafer. The second wafer includes a second conductive segment, a third conductive segment, and a fourth conductive segment each disposed at or near a bonding surface of the second wafer. The second, third, and fourth conductive segments are positioned at locations that correspond to the location of the first conductive segment in the first wafer. The first and second conductive segments form a first cross-wafer capacitor. The first and third conductive segments form a second cross-wafer capacitor. And the first and fourth conductive segments form a third cross-wafer capacitor.

In another aspect, a method of testing the alignment of two wafers bonded to each other may include attaching a first wafer to a second wafer, where each wafer includes a conductive segment positioned adjacent to a bonding surface of the wafers. The conductive segments and the dielectric material between the two conductive segments can be configured to produce a cross-wafer capacitor having an expected capacitance when the two wafers are attached to each other. After attaching the first and second wafers to each other, the capacitance of the cross-wafer capacitor may be measured or determined to determine or measure the alignment of the two wafers. The measured capacitance may not equal or substantially match the expected capacitance when the two wafers are not substantially aligned with respect to each other. The greater the misalignment between the two wafers, the greater the difference between the measured capacitance and the expected capacitance may be. In some embodiments, the two wafers may be separated and re-attached and the capacitance measured to determine the alignment. Alternatively, the two attached wafers may be discarded.

In yet another aspect, a cross-wafer capacitor includes a first conductive segment formed in a first wafer, and a second conductive segment formed in a second wafer. The first and second wafers are attached together to form a cross-wafer capacitor at a wafer-to-wafer interface.

BRIEF DESCRIPTION OF THE DRAWINGS

Embodiments of the invention are better understood with reference to the following drawings. The elements of the drawings are not necessarily to scale relative to each other. Identical reference numerals have been used, where possible, to designate identical features that are common to the figures.

DETAILED DESCRIPTION

Embodiments described herein provide one or more cross-wafer capacitors in an electronic component, circuit, or device that includes stacked wafers. One example of such a device is a stacked image sensor. The image sensor can include two or more wafers, with two wafers that are bonded to each other each including a conductive segment adjacent to, proximate, or abutting a bonding surface of the respective wafer. The conductive segments are positioned relative to each other such that each conductive element forms a plate of a capacitor. A cross-wafer capacitor is formed when the two wafers are attached to each other.

Directional terms such as "on", "over", "top", "bottom", are used with reference to the orientation of the Figure(s) being described. Because components of embodiments of the present invention can be positioned in a number of different orientations, the directional terminology is used for purposes of illustration only and is in no way limiting. When used in conjunction with layers of an image sensor wafer or corresponding image sensor, the directional terminology is intended to be construed broadly, and therefore should not be interpreted to preclude the presence of one or more intervening layers or other intervening image sensor features or elements. Thus, a given layer that is described herein as being formed on or formed over another layer may be separated from the latter layer by one or more additional layers.

Additionally, the term "wafer" is to be understood as a wafer or a die in a stacked integrated device or circuit. The terms "substrate" and "wafer" are to be understood as a semiconductor-based material including, but not limited to, silicon, silicon-on-insulator (SOI) technology, silicon-on-sapphire (SOS) technology, doped and undoped semiconductors, epitaxial layers formed on a semiconductor substrate, well regions or buried layers formed in a semiconductor substrate, and other semiconductor structures.

Figure 1A:
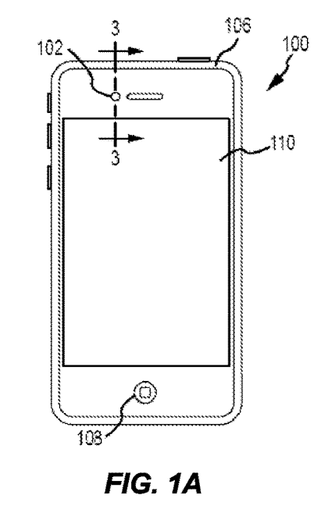
FIG. 1A illustrates a front view of an electronic device including one or more cameras.
Figure 1B:
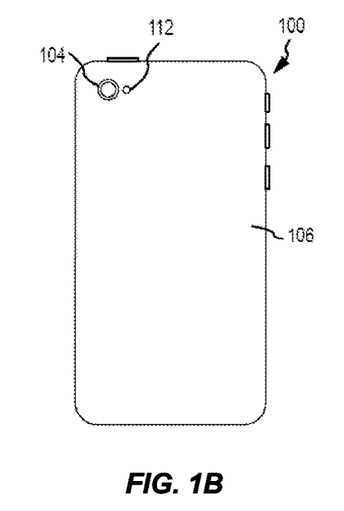
FIG. 1B depicts a rear view of the electronic device of FIG. 1A.

Referring now to FIGS. 1A-1B, there are shown front and rear views of an electronic device that includes one or more cameras. The electronic device 100 includes a first camera 102, a second camera 104, an enclosure 106, a display 110, an input/output (I/O) member 108, and a flash 112 or light source for the camera or cameras. The electronic device 100 can also include one or more internal components (not shown) typical of a computing or electronic device, such as, for example, one or more processors, memory components, network interfaces, and so on.

In the illustrated embodiment, the electronic device 100 is implemented as a smart telephone. Other embodiments, however, are not limited to this construction. Other types of computing or electronic devices can include one or more cameras, including, but not limited to, a netbook or laptop computer, a tablet computing device, a digital camera, a printer, a scanner, a video recorder, a wearable communication device, and a copier.

As shown in FIGS. 1A-1B, the enclosure 106 can form an outer surface or partial outer surface and protective case for the internal components of the electronic device 106, and may at least partially surround the display 110. The enclosure 106 can be formed of one or more components operably connected together, such as a front piece and a back piece. Alternatively, the enclosure 106 can be formed of a single piece operably connected to the display 110.

The I/O member 108 can be implemented with any type of input or output member. By way of example only, the I/O member 108 can be a switch, a button, a capacitive sensor, or other input mechanism. The I/O member 108 allows a user to interact with the electronic device 100. For example, the I/O member 108 may be a button or switch to alter the volume, return to a home screen, and the like. The electronic device can include one or more input members or output members, and each member can have a single I/O function or multiple I/O functions.

The display 110 can be operably or communicatively connected to the electronic device 100. The display 110 can be implemented with any type of suitable display, such as a retina display or an active matrix color liquid crystal display. The display 110 can provide a visual output for the electronic device 100 or function to receive user inputs to the electronic device. For example, the display 110 can be a multi-touch capacitive sensing touchscreen that can detect one or more user touch and/or force inputs.

Figure 2:
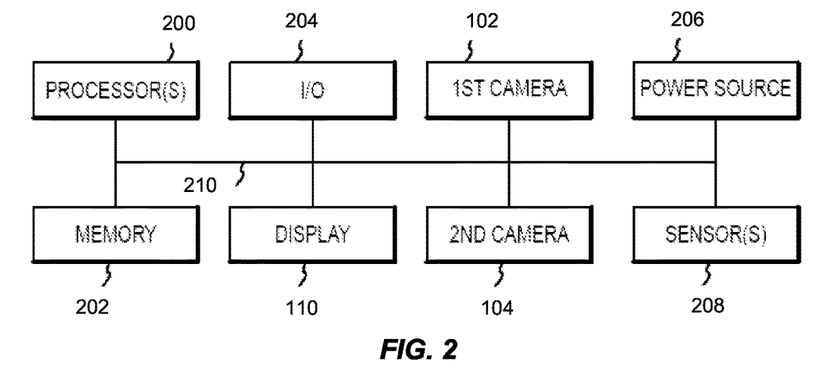
FIG. 2 illustrates a simplified block diagram of the electronic device of FIG. 1.

The electronic device 100 can also include a number of internal components. FIG. 2 illustrates one example of a simplified block diagram of the electronic device 100. The electronic device can include one or more processors 200, storage or memory components 202, input/output interface 204, power sources 206, and sensors 208, each of which will be discussed in turn below.

The one or more processors 200 can control some or all of the operations of the electronic device 100. The processor (s) 200 can communicate, either directly or indirectly, with substantially all of the components of the electronic device 100. For example, one or more system buses 210 or other communication mechanisms can provide communication between the processor(s) 200, the cameras 102, 104, the display 110, the I/O member 108, or the sensors 208. The processor(s) 200 can be implemented as any electronic device capable of processing, receiving, or transmitting data or instructions. For example, the one or more processors 200 can be a microprocessor, a central processing unit (CPU), an application-specific integrated circuit (ASIC), a digital signal processor (DSP), or combinations of multiple such devices. As described herein, the term "processor" is meant to encompass a single processor or processing unit, multiple processors, multiple processing units, or other suitably configured computing element or elements.

The memory 202 can store electronic data that can be used by the electronic device 100. For example, the memory 202 can store electrical data or content such as, for example, audio files, document files, timing signals, and image data. The memory 202 can be configured as any type of memory. By way of example only, memory 202 can be implemented as random access memory, read-only memory, Flash memory, removable memory, or other types of storage elements, individually or in any combination.

The input/output interface 204 can receive data from a user or one or more other electronic devices. Additionally, the input/output interface 204 can facilitate transmission of data to a user or to other electronic devices. For example, in embodiments where the electronic device 100 is a smart telephone, the input/output interface 204 can receive data from a network or send and transmit electronic signals via a wireless or wired connection. Examples of wireless and wired connections include, but are not limited to, cellular, Wi-Fi, Bluetooth, and Ethernet. In one or more embodiments, the input/output interface 204 supports multiple network or communication mechanisms. For example, the input/output interface 204 can pair with another device over a Bluetooth network to transfer signals to the other device while simultaneously receiving signals from a Wi-Fi or other wired or wireless connection.

The power source 206 can be implemented with any device capable of providing energy to the electronic device 100. For example, the power source 206 can be a battery or a connection cable that connects the electronic device 100 to another power source such as a wall outlet.

The sensors 208 can by implemented with any type of sensors. Examples of sensors include, but are not limited to, audio sensors (e.g., microphones), light sensors (e.g., ambient light sensors), gyroscopes, and accelerometers. The sensors 208 can be used to provide data to the processor 200, which may be used to enhance or vary functions of the electronic device.

It should be noted that FIGS. 1 and 2 are illustrative only. In other examples, an electronic device may include fewer or more components than those shown in the figures. For example, some of the components shown in FIG. 2 can be implemented in a separate electronic device that is operatively connected to the electronic device 100 through a wired or wireless connection. As one example, at least one I/O device can be included in a separate electronic device that is operably connected to the electronic device 100.

Figure 3:
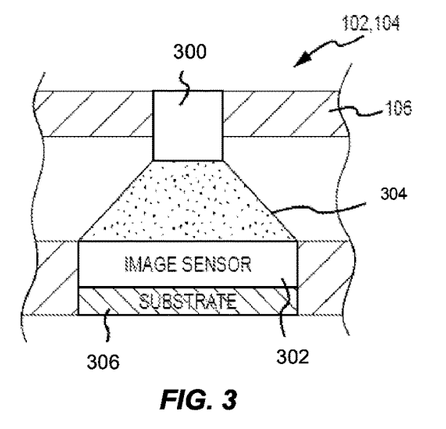
FIG. 3 depicts a cross-section view of the electronic device of FIG. 1A taken along line 3-3 in FIG. 1A.

As described with reference to FIGS. 1A and 1B, the electronic device 100 includes one or more cameras 102, 104 and optionally a flash 112 or light source for the camera or cameras. FIG. 3 is a simplified cross-section view of the camera 102 taken along line 3-3 in FIG. 1A. Although FIG. 3 illustrates the first camera 102, those skilled in the art will recognize that the second camera 104 can be substantially similar to the first camera 102. In some embodiments, one camera may include a global shutter configured image sensor and one camera can include a rolling shutter configured image sensor. In other examples, one camera can include an image sensor with a higher resolution than the image sensor in the other camera, or the image sensors can be configured as two different types of image sensors (e.g., CMOS and CCD).

The cameras 102, 104 include an imaging stage 300 that is in optical communication with an image sensor 302. The imaging stage 300 is operably connected to the enclosure 106 and positioned in front of the image sensor 302. The imaging stage 300 can include conventional elements such as a lens, a filter, an iris, and a shutter. The imaging stage 300 directs, focuses, or transmits light 304 within its field of view onto the image sensor 302. The image sensor 302 captures one or more images of a subject scene by converting the incident light into electrical signals. The image sensor 302 can be supported by and/or formed in a substrate 306.

Various elements of imaging stage 300 or image sensor 302 can be controlled by timing signals or other signals supplied from a processor or memory, such as processor 200 in FIG. 2. Some or all of the elements in the imaging stage 300 can be integrated into a single component. Additionally, some or all of the elements in the imaging stage 300 can be integrated with the image sensor 302, and possibly one or more additional elements of the electronic device 100, to form a camera module. For example, a processor or a memory may be integrated with the image sensor 302 in some embodiments.

Figure 4:
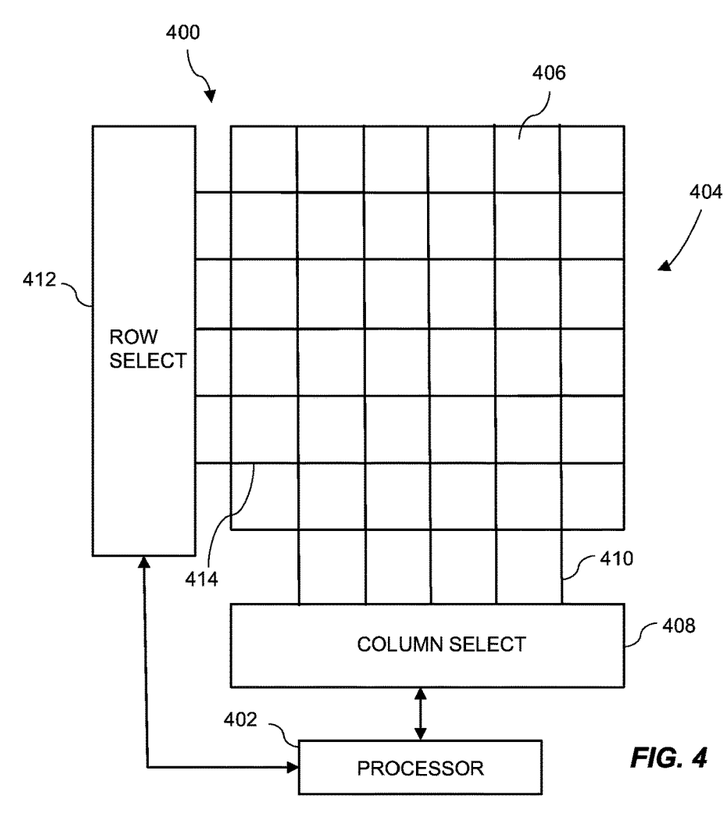
FIG. 4 illustrates a simplified block diagram of one example of an image sensor that is suitable for use as image sensor 302.

Referring now to FIG. 4, there is shown a simplified block diagram of one example of an image sensor suitable for use as image sensor 302 shown in FIG. 3. The illustrated image sensor is a CMOS image sensor. The image sensor 400 can include an image processor 402 and an imaging area 404. The imaging area 404 can be implemented as a pixel array that includes multiple pixels 406. In the illustrated embodiment, the pixel array is configured in a row and column arrangement. However, other embodiments are not limited to this configuration. The pixels in a pixel array can be arranged in any suitable configuration, such as, for example, a hexagon configuration.

The imaging area 404 may be operably connected to a column select 408 through one or more column select lines 410, and a row select 412 through one or more row select lines 414. The row select 412 selectively activates a particular pixel 406 or group of pixels, such as all of the pixels 406 in a certain row. The column select 408 selectively receives the data output from the select pixels 406 or groups of pixels (e.g., all of the pixels with a particular column).

The row select 412 and/or the column select 408 may be operably connected to the image processor 402. The image processor 402 can provide timing signals to the row select 412 and the column select 408 to transfer or readout charge or signals (i.e., data) from the photodetectors (not shown) in the pixels 406. The image processor 402 can process data from the pixels 406 and provide that data to the processor 200 and/or other components of the electronic device 100. It should be noted that in some embodiments, the image processor 402 can be incorporated into the processor 200 or separate therefrom.

Figure 5:
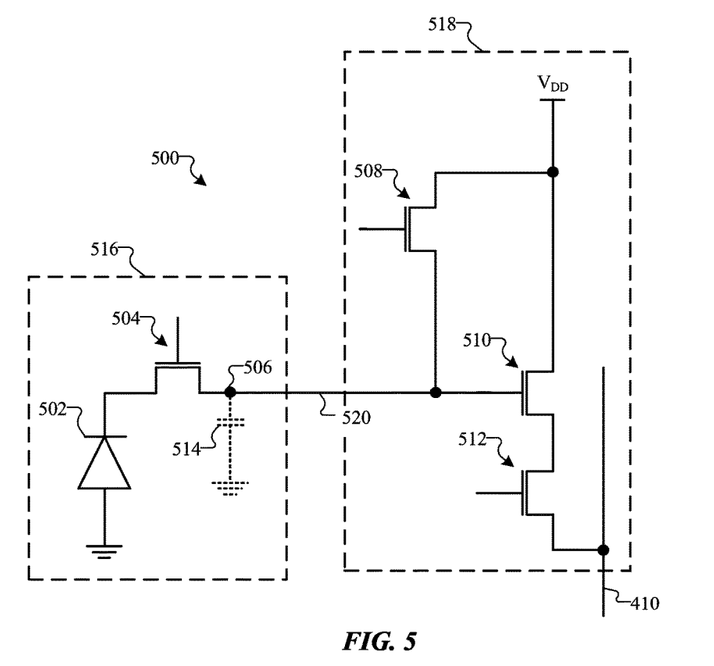
FIG. 5 depicts a simplified schematic view of a pixel suitable for use in an image sensor.

Referring now to FIG. 5, there is shown a simplified schematic view of a pixel that is suitable for use as pixels 406 shown in FIG. 4. The pixel 500 includes a photodetector 502, a transfer transistor 504, a sense region 506, a reset transistor 508, a readout transistor 510, and a row select transistor 512. The sense region 506 is represented as a capacitor 514 in the illustrated embodiment because the sense region 506 can temporarily store charge received from the photodetector 502. As described below, after charge is transferred from the photodetector 502, the charge can be stored in the sense region 506 until the gate of the row select transistor 512 is pulsed.

One terminal of the transfer transistor 504 is connected to the photodetector 502 while the other terminal is connected to the sense region 506. One terminal of the reset transistor 508 and one terminal of the readout transistor 510 are connected to a supply voltage $V_{DD}$. The other terminal of the reset transistor 508 is connected to the sense region 506, while the other terminal of the readout transistor 510 is connected to a terminal of the row select transistor 512. The other terminal of the row select transistor 512 is connected to an output line 410.

By way of example only, in one embodiment the photodetector 502 is implemented as a photodiode or pinned photodiode, the sense region 506 as a floating diffusion, and the readout transistor 510 as a source follower transistor. The photodetector 502 can be an electron-based photodiode or a hole based photodiode. It should be noted that the term photodetector as used herein is meant to encompass substantially any type of photon or light detecting component, such as a photodiode, pinned photodiode, photogate, or other photon sensitive region. Additionally, the term sense region as used herein is meant to encompass substantially any type of charge storing or charge converting region.

Those skilled in the art will recognize that the pixel 500 can be implemented with additional or different components in other embodiments. For example, a row select transistor can be omitted and a pulsed power supply mode used to select the pixel, the sense region can be shared by multiple photodetectors and transfer transistors, or the reset and readout transistors can be shared by multiple photodetectors, transfer gates, and sense regions.

When an image is to be captured, an integration period for the pixel begins and the photodetector 502 accumulates photo-generated charge in response to incident light. When the integration period ends, the accumulated charge in the photodetector 502 is transferred to the sense region 506 by selectively pulsing the gate of the transfer transistor 504. Typically, the reset transistor 508 is used to reset the voltage on the sense region 506 to a predetermined level prior to the transfer of charge from the photodetector 502 to the sense region 506. When charge is to be readout of the pixel, the gate of the row select transistor is pulsed through the row select 412 and row select line 414 to select the pixel (or row of pixels) for readout. The readout transistor 510 senses the voltage on the sense region 506 and the row select transistor 512 transmits the voltage to the output line 410. The output line 410 is connected to readout circuitry and (optionally an image processor) through the output line 410 and the column select 408.

In some embodiments, an image capture device, such as a camera, may not include a shutter over the lens, and so the image sensor may be constantly exposed to light. In these embodiments, the photodetectors may have to be reset or depleted before a desired image is to be captured. Once the charge from the photodetectors has been depleted, the transfer gate and the reset gate are turned off, isolating the photodetectors. The photodetectors can then begin integration and collecting photo-generated charge.

In some embodiments, the image sensor is formed in a single semiconductor substrate or wafer, and may be configured as a front-illuminated image sensor or a back-illuminated image sensor. In a front-illuminated image sensor, the metal layer, which can include one or more layers of signal lines, contacts, interconnects, is positioned between the light-receiving side or surface of the image sensor and the pixels. Light must pass through the metal layer before the light is detected by the photodetectors in the pixels. In some embodiments, the metal layer can reflect some of the light, which may result in crosstalk and reduced image quality.

Figure 6:
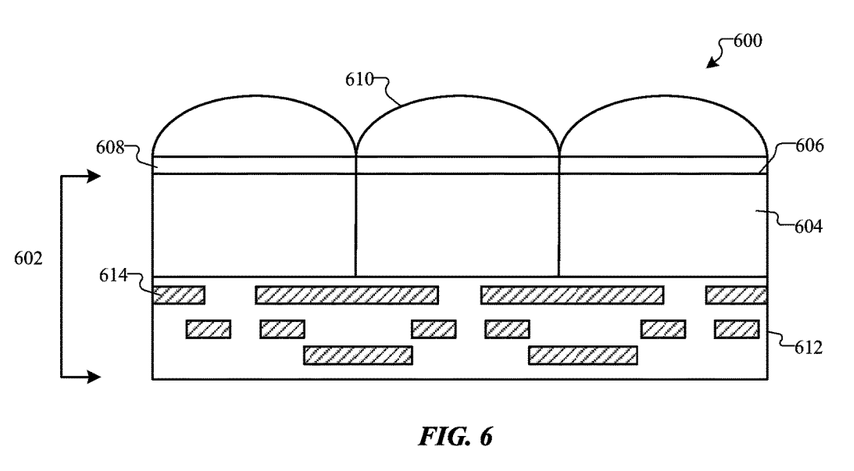
FIG. 6 is a simplified cross-sectional view of one example of a back-illuminated image sensor.

A back-illuminated image sensor (BIS) contains the same elements, but the pixel layer is positioned between the light-receiving surface and the metal layer. A BIS image sensor is fabricated by flipping the semiconductor wafer during manufacturing and thinning the reverse side so that light can strike the pixels without passing through the metal layer. FIG. 6 is a simplified cross-sectional view of one example of a BIS. The image sensor 600 is formed in one wafer 602. The pixels 604 are immediately adjacent to the light-receiving surface 606 of the image sensor 600. The pixels 604 can be implemented as shown in FIG. 5, although other embodiments can configure the pixels differently. A color filter array 608 may be disposed over the light-receiving surface 604, and microlenses 610 can be disposed over the color filter array 608. The metal layer 612 is below the pixels 604. As described earlier, the metal layer can include one or more layers of conductive elements 614 (e.g., signal lines, interconnects, contacts, and/or circuits).

Figure 7:
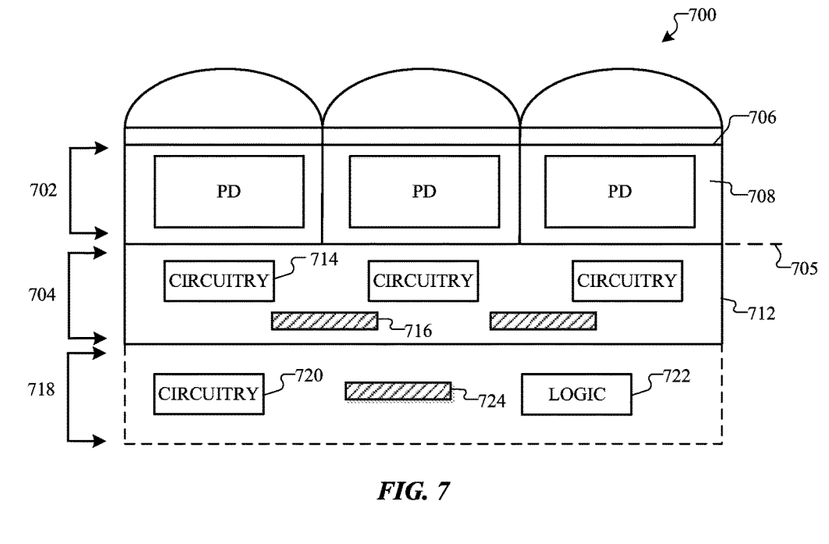
FIG. 7 is a simplified cross-sectional view of one example of a vertically stacked image sensor.

In other embodiments, the image sensor is formed on two wafers in a vertically stacked configuration. FIG. 7 is a simplified cross-sectional view of one example of a vertically stacked image sensor. The image sensor 700 is formed with two wafers 702, 704. A sensor wafer 702 is attached (e.g., bonded) to a circuit wafer 704 at a wafer-to-wafer interface 705. In one embodiment, the sensor wafer 702 can include an array of photodetectors with each photodetector connected to a transfer transistor (see e.g., photodetector 502 and transfer transistor 504 in area 516 of FIG. 5). The photodetectors are positioned between the circuit wafer 704 and the light-receiving surface 706 of the image sensor.

The photodetectors in the sensor wafer 702 are operably connected to respective circuitry 714 in the circuit wafer 704 through an inter-wafer connector (e.g., 520 in FIG. 5). Each circuitry 714 can be operably connected to a single photodetector (PD) in the sensor wafer 702, or two or more photodetectors (PD) can share a circuitry 714. In one embodiment, the sensor wafer 702 can include the components shown in area 516 and the circuit wafer 704 the components shown in area 518 of FIG. 5. The circuit wafer 704 may also include one or more layers of conductive elements 716 (e.g., signal lines, interconnects, contacts, and/or circuits).

In some embodiments, the image sensor 700 can include one or more additional wafers 718. The one or more additional wafers 718 can include circuitry 720, logic element(s) 722, one or more conductive elements 724, and/or any other suitable components. As one example, logic elements 722 can be used to enable and disable one or more components in circuitry 714 in the circuit wafer 704.

Figure 8:
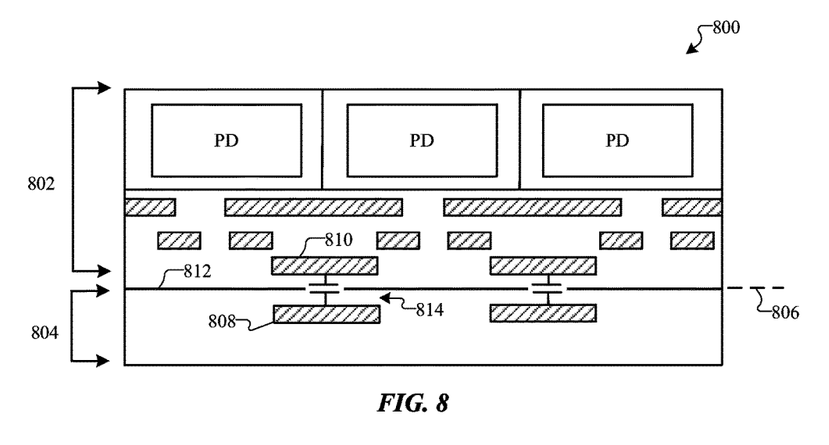
FIG. 8 is a simplified cross-sectional view of a first example of an image sensor with a cross-wafer capacitor.

Referring now to FIG. 8, there is shown a simplified cross-sectional view of a first example of an image sensor with a cross-wafer capacitor. The color filter layer and microlenses have been omitted for simplicity and clarity. The image sensor 800 includes a BIS image sensor 802 attached to an additional wafer 804 at a wafer-to-wafer interface 806. Conductive segments 808 are formed in the additional wafer 804. Although only conductive segments 808 are shown in the additional wafer 804, other embodiments can include conductive segments 808, circuitry, logic element(s), one or more conductive elements, and/or any other suitable components in the additional wafer 804.

The BIS image sensor 802 includes one or more conductive segments 810 that are formed adjacent to or proximate the non-light receiving surface 812 of the BIS image sensor. A conductive segment 810 is positioned at a location corresponding to the location of the conductive segment 808 in the additional wafer 804. The two conductive segments 808, 810 form the two plates of a capacitor. Thus, a cross-wafer capacitor 814 is created by the two conductive segments 808, 810, with each wafer providing one plate of the capacitor. An image sensor can include one or more cross-wafer capacitors.

In the illustrated embodiment, the BIS wafer 802 and the additional wafer 804 can be attached to each other using any suitable technique. For example, in one embodiment the BIS wafer 802 and the additional wafer 804 are bonded to each other using a dielectric bonding technique (e.g., oxide-to-oxide bonding). In some embodiments, silicon vias (not shown) can be formed between the two wafers to connect the two wafers.

In some embodiments, two wafers can be bonded to each other using a copper-to-copper direct bonding technique. When the copper is allowed to oxidize, a dielectric can be formed between the two conductive segments.

Figure 9:
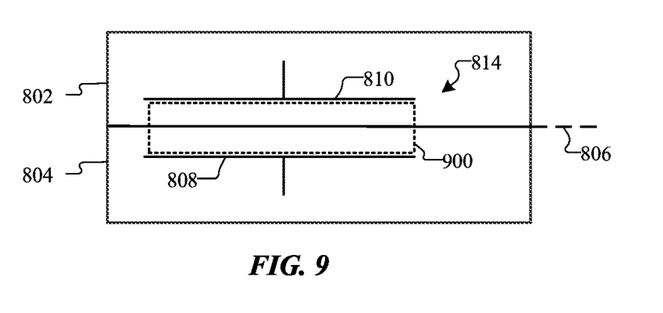
FIGS. 9-11 illustrate different configurations of one or more cross-wafer capacitors.

A cross-wafer capacitor can provide an image sensor with additional functions. As one example, charge may be transferred from a photodetector to a cross-wafer capacitor, where the charge is stored temporarily before being read out. For example, cross-wafer capacitors can be used during a global shutter operation. Additionally or alternatively, charge may be transferred from two or more photodetectors to a cross-wafer capacitor and stored temporarily. The charge from the two or more photodetectors is summed at the cross-wafer capacitor. Additionally or alternatively, a cross-wafer capacitor can be used to transfer charge or a signal from one wafer to the other wafer. FIG. 9 illustrates one example of a cross-wafer capacitor that is suitable for providing these functions. In FIG. 9, dielectric material is positioned between the conductive segments 808, 810. In some embodiments, the dielectric material is the material that forms the wafers 802, 804. In other embodiments, the dielectric material can be a material that is different from the wafer material. For example, the dielectric material 900 can be an implant region that is formed by implanting or diffusing one or more dopants into the region prior to bonding the two wafers 802, 804 to each other.

Figure 10:
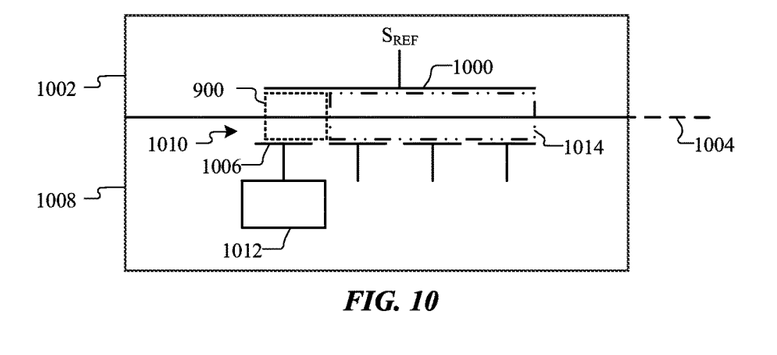

Additionally or alternatively, a cross-wafer capacitor can isolate a first wafer from a second wafer while providing temporary storage for the second wafer. For example, FIG. 10 illustrates a first conductive segment 1000 that is formed in a first wafer 1002 on one side of the wafer-to-wafer interface 1004 and multiple conductive segments 1006 formed in a second wafer 1008 on the other side of the wafer-to-wafer interface. The conductive segment 1000 can isolate the first wafer 1002 from the second wafer 1008 when the conductive segment 1000 is connected to a reference signal $S_{REF}$ (e.g., ground). The multiple conductive segments 1006 each form a cross-wafer capacitor 1010 that can be used by the second wafer 1008. The conductive segments 1006 in the second wafer 1008 can be connected to one or more discrete circuits or signal lines 1012. Some or all of the cross-wafer capacitors 1010 can be connected to the same circuit or signal line, or each cross-wafer capacitor 1010 may be connected to a separate circuit or signal line 1012.

Dielectric material 900, 1014 is positioned between the conductive segments 1000, 1006. The dielectric material 900 and 1014 may be the same type of dielectric material, or the dielectric material 900 and 1014 can be different types of dielectric material. For example, the dielectric material 900 and 1014 is the material that forms the wafers 1002, 1008. In other example, the dielectric material 1014 can be a material that is different from the wafer material and from the dielectric material 900. One or both dielectric materials 900 and 1014 can each be an implant region that is formed by implanting or diffusing one or more dopants into the region prior to bonding the two wafers 1002, 1008 to each other. Additionally, the dopant(s) in dielectric material 900 can differ from the dopant(s) in dielectric material 1014. Each cross-wafer capacitor 1010 can have a different dielectric material disposed between the conductive segments that form that cross-wafer capacitor, or at least one cross-wafer capacitor 1010 may include a different dielectric material from the other cross-wafer capacitors.

Figure 11:
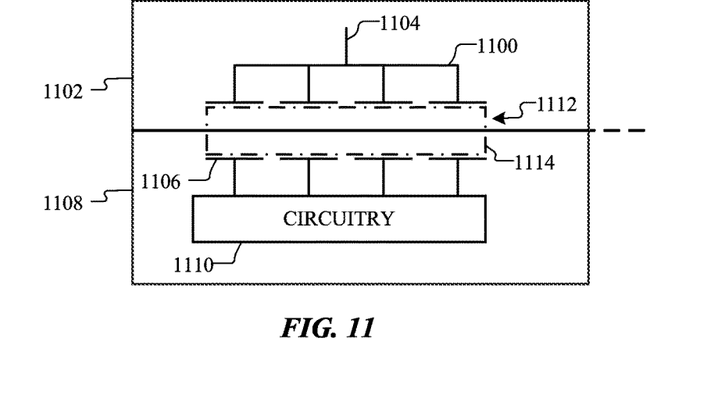

FIG. 11 depicts cross-wafer capacitors where the conductive segments 1100 in the first wafer 1102 are connected to a common node 1104. The conductive segments 1106 in the second wafer 1108 can be connected to one or more discrete circuits or signal lines 1110. Some or all of the cross-wafer capacitors 1112 can be connected to the same circuit or signal line 1110, or each cross-wafer capacitor 1112 may be connected to a separate circuit or signal line 1110.

Dielectric material 1114 is positioned between the conductive segments 1100, 1106. Similar to the embodiment shown in FIG. 10, the dielectric material 1114 included in each cross-wafer capacitor 1112 can have the same or a different dielectric material disposed between the conductive segments that form that cross-wafer capacitor, or at least one cross-wafer capacitor 1112 may include a different dielectric material from the other cross-wafer capacitors.

Figure 12:
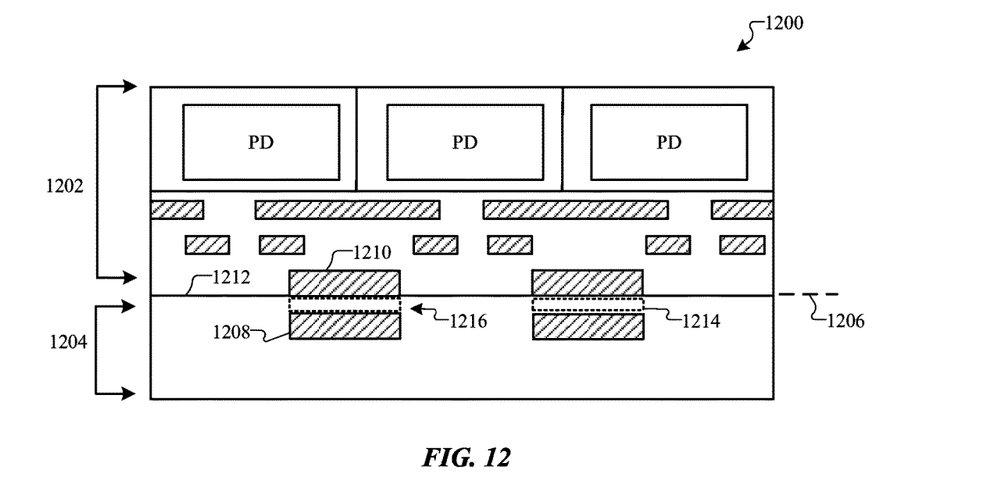
FIG. 12 is a simplified cross-sectional view of a second example of an image sensor with a cross-wafer capacitor.

Referring now to FIG. 12, there is shown a simplified cross-sectional view of a second example of an image sensor with a cross-wafer capacitor. The color filter layer and microlenses have been omitted for simplicity and clarity. The image sensor 1200 includes a BIS image sensor 1202 attached to an additional wafer 1204 at wafer-to-wafer interface 1206. Conductive segments 1208 are formed in the additional wafer 1204. Although only the conductive segments 1208 are shown in the additional wafer 1204, other embodiments can include conductive segments and one or more layers of conductive elements in the additional wafer.

The BIS image sensor 1202 includes conductive segments 1210 that are formed adjacent or proximate to the non-light receiving surface 1212 of the BIS image sensor. The conductive segments 1208 and 1210 are positioned with respect to each other and form the two plates of a capacitor. Dielectric material 1214 is positioned between the conductive segments 1208, 1210. Thus, a cross-wafer capacitor 1216 is produced by the two conductive segments 1208, 1210. The BIS wafer 1202 provides one plate of the capacitor and the additional wafer 1204 provides the other plate of the capacitor.

In the illustrated embodiment, the conductive segments 1210 are formed such that the conductive segments abut the non-light receiving surface 1212 (e.g., the bonding surface). In another embodiment, the conductive segments 1208 may abut the non-light receiving surface 1212. And in yet another embodiment, a conductive segment 1210 of one cross-wafer capacitor 1216 may abut the non-light receiving surface while a conductive segment 1208 of a different cross-wafer capacitor 1216 abuts the non-light receiving surface 1212. The BIS wafer 1202 and the additional wafer 1204 can be attached to each other using any suitable technique. For example, in one embodiment the BIS wafer 1202 and the additional wafer 1204 are bonded to each other using a copper-to-copper direct bonding technique.

Figure 13:
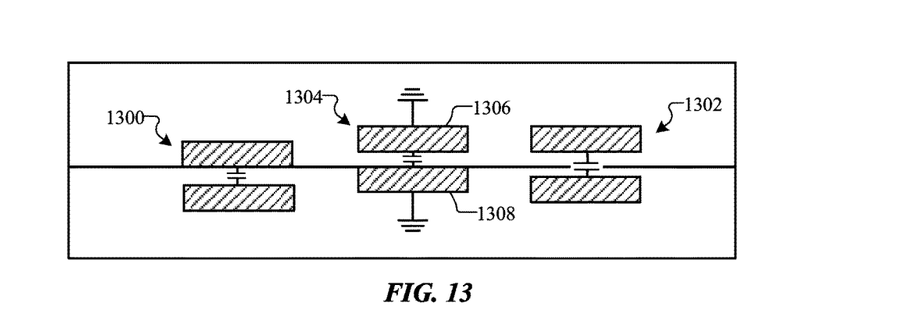
FIG. 13 depicts an arrangement of cross-wafer capacitors that can prevent or reduce cross-capacitance between two cross-wafer capacitors.

In some situations, cross-capacitance or parasitic capacitive coupling can occur in embodiments that form two cross-wafer capacitors adjacent to one another. FIG. 13 depicts an arrangement of cross-wafer capacitors that can prevent or reduce cross-capacitance between two cross-wafer capacitors. First and second cross-wafer capacitors 1300, 1302 are formed adjacent to one another. An intermediate cross-wafer capacitor 1304 can be formed between the first and second cross-wafer capacitors 1300, 1302. Both conductive segments 1306, 1308 that form the intermediate capacitor 1304 are connected to ground. Thus, the intermediate cross-wafer capacitor isolates the first and second cross-wafer capacitors 1300, 1302 and reduces or prevents cross-capacitance from developing between the first and second cross-wafer capacitors.

Figure 14:
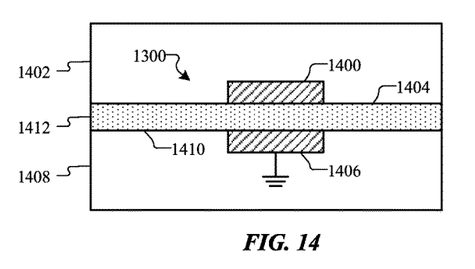
FIG. 14 is a simplified cross-sectional view of a third example of an image sensor that includes a cross-wafer capacitor.

Referring now to FIG. 14, there is shown a simplified cross-sectional view of a third example of an image sensor that includes a cross-wafer capacitor. A first conductive segment 1400 is formed in a first wafer 1402. The first conductive segment 1400 abuts a bonding surface 1404 of the first wafer 1402. A second conductive segment 1406 is formed in a second wafer 1408. The second conductive segment 1406 abuts a bonding surface 1410 of the second wafer 1408. Dielectric material 1412 is positioned between the first and second wafers 1402, 1408. Any suitable dielectric material or materials can be used. In one embodiment, the dielectric material can be disposed over (e.g., deposited) one of the bonding surfaces 1404 or 1410 before the two wafers 1402, 1408 are bonded to each other. In another embodiment, the dielectric material 1412 may be formed in one of the wafers. And in yet another embodiment, the dielectric material 1412 can include dielectric material formed in at least one wafer as well as dielectric material that is disposed over a bonding surface of one of the wafers.

Figure 15:
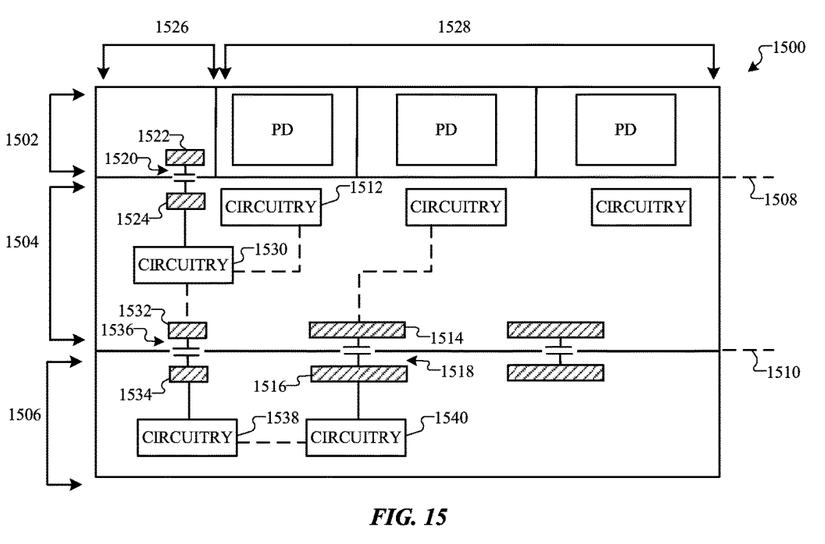
FIG. 15 is a simplified cross-sectional view of a fourth example of an image sensor with a cross-wafer capacitor.

FIG. 15 illustrates a simplified cross-sectional view of a fourth example of an image sensor that includes a cross-wafer capacitor. The color filter layer and microlenses have been omitted for simplicity and clarity. The BIS image sensor 1500 includes three stacked wafers 1502, 1504, 1506. The first wafer 1502 can be configured as a sensor wafer, the second wafer 1504 as a circuit wafer, and the third wafer 1506 as an additional wafer. The first and second wafers 1502, 1504 are attached at wafer-to-wafer interface 1508. The second and third wafers 1504, 1506 are attached at wafer-to-wafer interface 1510. Any suitable technique can be used to attach the first, second, and third wafers.

The second wafer 1504 includes one or more components (circuitry) 1512 for one or more photodetectors (PD) in the sensor wafer 1502. The second wafer 1504 may also include one or more layers of conductive elements (not shown). One or more conductive segments 1514 are formed in the second wafer 1504 proximate or adjacent to the wafer-to-wafer interface 1510. In some embodiments, one or more conductive segments 1514 may be connected to one or more circuitry 1512 (connection shown with dashed line).

The third wafer 1506 includes one or more conductive segments 1516 formed adjacent or proximate to the wafer-to-wafer interface 1510. A conductive segment 1516 is positioned at a location in the third wafer 1506 that corresponds to the location of a respective conductive segment 1514 in the second wafer 1504 so that the two conductive segments 1514, 1516 form a cross-wafer capacitor 1518. Thus, a cross-wafer capacitor 1518 is formed at the wafer-to-wafer interface 1510. The second wafer 1504 provides one plate of the capacitor and the third wafer 1506 provides the other plate of the capacitor.

In some embodiments, one or more cross-wafer capacitors 1520 can be formed by a conductive segment 1522 in the sensor wafer 1502 and a conductive segment 1524 in the circuit wafer 1504. As one example, the cross-wafer capacitor 1520 can be formed in a non-imaging area 1526 of the image sensor 1500. The non-imaging area 1526 is an area outside of (e.g., adjacent to or surrounding) the pixel array 1528. The pixel array 1528 is the imaging area of the image sensor in that some or all of the photodetectors (PD) in the pixel array 1528 are used to capture images. The conductive segments 1522, 1524 can each be formed proximate or adjacent to the wafer-to-wafer interface 1508. Thus, cross-wafer capacitors can be formed along one or both wafer-to-wafer interfaces 1508, 1510 in the illustrated embodiment.

The conductive segment 1522 can be connected to a circuitry (not shown) that provides a signal to the cross-wafer capacitor 1520. The circuitry can be included in the image sensor 1500, or the circuitry can be outside of the image sensor but electrically connected to the conductive segment 1522. Circuitry 1530 may be formed in the second wafer 1504 and connected to the conductive segment 1524. The circuitry 1530 can include a signal line and/or one or more circuits that receives the signal from the cross-wafer capacitor 1520. The circuitry 1530 may optionally be connected to the circuitry 1512 (connection shown with dashed line). Additionally or alternatively, the circuitry 1530 can be connected to another conductive segment 1532 formed in the second wafer 1504 (connection shown with dashed line). A conductive segment 1534 formed in the third wafer 1506 can form a cross-wafer capacitor 1536 at the wafer-to-wafer interface 1510.

Circuitry 1538 may be formed in the third wafer 1506 and connected to the conductive segment 1534. The circuitry 1538 can include a signal line and/or one or more circuits that receive a signal from the cross-wafer capacitor 1536. The circuitry 1538 may optionally be connected to the circuitry 1540 that is formed in the third wafer 1506 (connection shown with dashed line). The circuitry 1540 can be connected to one or more conductive segments 1516 (connection shown with dashed line). Thus, the circuitry 1540 can receive a signal from one or more cross-wafer capacitors 1518 and/or from the cross-wafer capacitor 1536. The circuitry 1530, 1538, and/or 1540 can be configured to receive one or more signals from components (e.g., circuits or devices) outside of, but electrically connected to the image sensor.

Although the circuitry 1538 and 1540 are described as being formed in the third wafer, in other embodiments one or both circuitry 1538, 1540 may be positioned outside of the image sensor and electrically connected to the respective conductive segments 1534, 1516.

In the illustrated embodiment of FIG. 15, a signal can be transmitted from the first wafer 1502 to the second wafer (e.g., to circuitry 1530) using the cross-wafer capacitor 1520. Additionally or alternatively, a signal can be transmitted from the first wafer 1502 to the third wafer 1506 (e.g., to circuitry 1538) using cross-wafer capacitors 1520 and 1536. Additionally or alternatively, a signal can be transmitted from the second wafer 1504 (e.g., from circuitry 1512) to the third wafer 1506 (e.g., to circuitry 1538) using the cross-wafer capacitor 1536. Similarly, a signal can be transmitted from the second wafer 1504 (e.g., from circuitry 1530) to the first wafer using the cross-wafer capacitor 1520. Additionally or alternatively, a signal can be transmitted from the third wafer 1506 (e.g., from circuitry 1538) to the first wafer 1502 using cross-wafer capacitors 1520 and 1536. Additionally or alternatively, a signal can be transmitted from the third wafer 1506 (e.g., from circuitry 1538) to the second wafer 1504 (e.g., to circuitry 1530) using the cross-wafer capacitor 1536.

Figure 16:
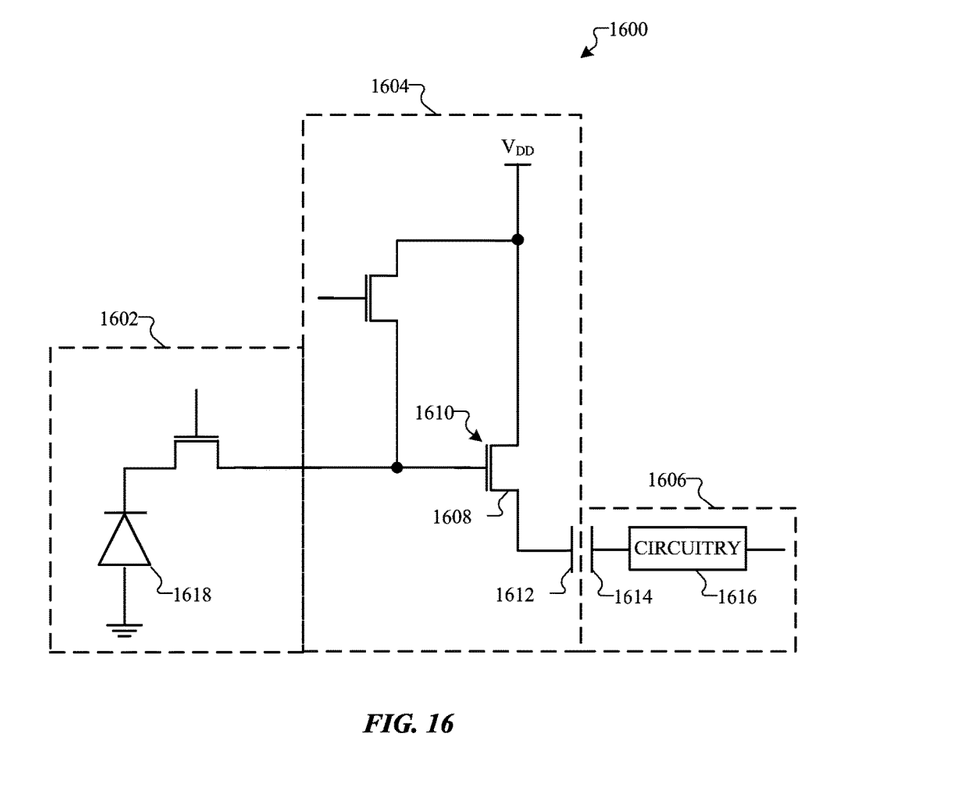
FIG. 16 is a simplified schematic of a stacked image sensor with a cross-wafer capacitor.

FIG. 16 is a simplified schematic of a stacked image sensor with a cross-wafer capacitor. The image sensor 1600 includes a sensor wafer 1602, a circuit wafer 1604, and a third wafer 1606. A terminal 1608 of a transistor 1610 in the circuit wafer 1604 may be connected to a conductive segment 1612 in the circuit wafer 1604. Another conductive segment 1614 in the third wafer 1606 is connected to circuitry 1616. In this manner, the transistor 1610 in the circuit wafer 1604 can be AC-coupled (i.e., capacitively coupled) to the circuitry 1616 in the third wafer 1606. In one embodiment, the illustrated image sensor 1600 can transfer the signal read out of one, some, or all of the photodetectors 1618 in the sensor wafer 1602 by respective transistors 1610 in the circuit wafer 1604 to respective circuitry 1616 in the third wafer 1606 at substantially the same time. In another embodiment, other signals can be transmitted between wafers using one or more cross-wafer capacitors.

Figure 17:
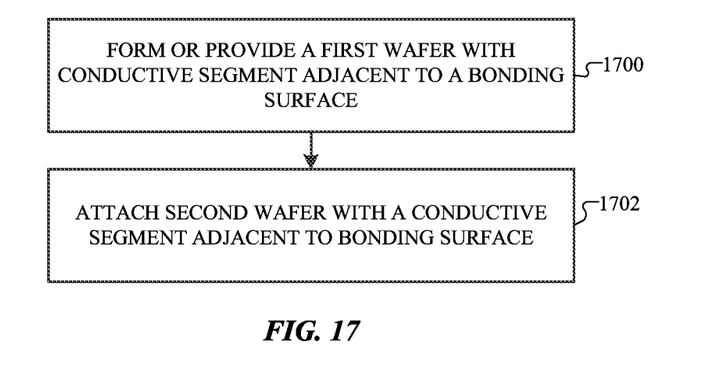
FIG. 17 is a flowchart of a method of constructing a cross-wafer capacitor in an image sensor.

Referring now to FIG. 17, there is shown a flowchart of a method of constructing a cross-wafer capacitor in an image sensor. Initially, a first wafer is formed (or provided) with one or more conductive segments positioned adjacent or proximate to bonding surface of the wafer (block 1700). The wafer can be constructed to be included in a BIS image sensor or in a vertically stacked image sensor. A second wafer is then attached to the first wafer at block 1702. The second wafer includes corresponding conductive segments formed adjacent or proximate to the bonding surface of the second wafer.

The capacitance of a cross-wafer capacitor can be determined by one or more factors. Example factors include, but are not limited to, the size of the conductive segments that form the cross-wafer capacitor, the distance between the conductive segments that form the cross-wafer capacitor, and/or the type of dielectric material between the conductive segments that form the cross-wafer capacitor. For example, the dielectric constant of the dielectric material can impact the capacitance of the cross-wafer capacitor. In some embodiments, the higher the dielectric constant, the higher the capacitance. Additionally or alternatively, the shorter the distance between the two conductive segments, the higher the capacitance.

Figure 18:
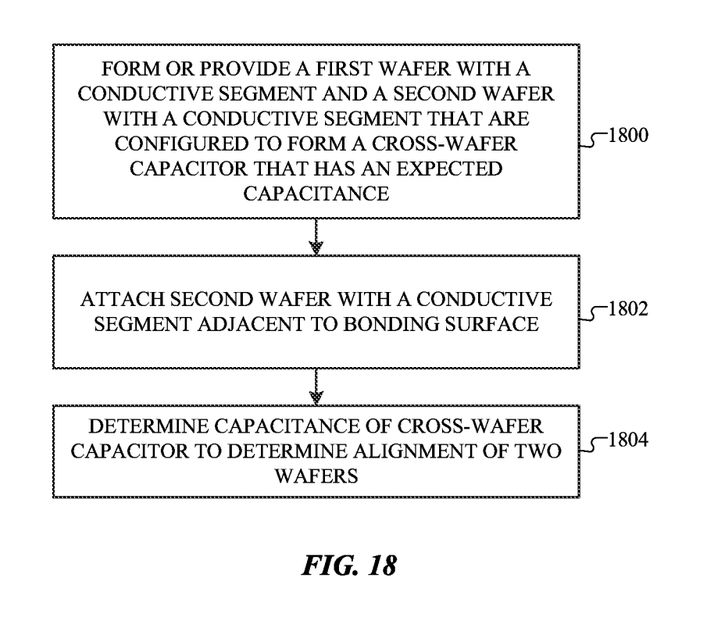
FIG. 18 is a flowchart of a method of determining the alignment between two wafers.

In some embodiments, one or more cross-wafer capacitors can be used to test the alignment of two wafers (see FIG. 18). For example, a first wafer can include a conductive segment formed adjacent to a bonding surface of the first wafer and a second wafer may include a conductive segment formed adjacent or proximate to a bonding surface of the second wafer. The conductive segments and dielectric material can be configured to produce a cross-wafer capacitor having an expected capacitance when the two wafers are attached to each other (block 1800). The first and second wafers are then attached to each other, as shown in block 1802. Thereafter, the capacitance of the cross-wafer capacitor may be measured or determined to determine or measure the alignment of the two wafers (block 1804). The measured capacitance will not equal or substantially match the expected capacitance when the two wafers are not substantially aligned with respect to each other. The greater the misalignment between the two wafers, the greater the difference between the measured capacitance and the expected capacitance may be. In some embodiments, the two wafers may be separated and re-attached and the capacitance measured to determine the alignment. Alternatively, the two attached wafers may be discarded.

Various embodiments have been described in detail with particular reference to certain features thereof, but it will be understood that variations and modifications can be effected within the spirit and scope of the disclosure. And even though specific embodiments have been described herein, it should be noted that the application is not limited to these embodiments. In particular, any features described with respect to one embodiment may also be used in other embodiments, where compatible. Likewise, the features of the different embodiments may be exchanged, where compatible.

What is claimed is:

1. An image sensor, comprising:
   a first wafer including a first conductive segment and a second conductive segment; and
   a second wafer attached to the first wafer and comprising:
     a third conductive segment positioned adjacent to the first conductive segment to produce a first cross-wafer capacitor; and
     a fourth conductive segment positioned adjacent to the second conductive segment to produce a second cross-wafer capacitor;
   wherein the first and the second conductive segments are directly connected to a common node, and the third and the fourth conductive segments are connected to discrete signal lines connected to one or more discrete circuits.

2. The image sensor as in claim 1, wherein the first wafer and the second wafer are attached to each other with copper-to-copper direct bonding.

3. The image sensor as in claim 1, further comprising a first dielectric material between the first and the third conductive segments and a different second dielectric material between the second and the fourth conductive segments.

4. The image sensor as in claim 1, wherein:
   the first and the second conductive segments are positioned at a first bonding surface of the first wafer;
   the third and the fourth conductive segments are positioned at a second bonding surface of the second wafer; and
   the image sensor further comprises a layer of dielectric material positioned between the first and the second bonding surfaces.

5. The image sensor as in claim 1, wherein the first wafer comprises a sensor wafer and the second wafer comprises a circuit wafer.

6. The image sensor as in claim 5, further comprising a third wafer attached to the second wafer, wherein
   the second wafer comprises a fifth conductive segment;
   the third wafer comprises a sixth conductive segment positioned adjacent to the fifth conductive segment to produce a third cross-wafer capacitor;
   a first circuitry is connected between the third conductive segment and the fifth conductive segment; and
   a second circuitry is connected to the sixth conductive segment.

7. The image sensor as in claim 6, further comprising a third circuitry connected to the fourth conductive segment.

8. The image sensor as in claim 6, wherein
   the fifth conductive segment is positioned at a third bonding surface of the second wafer;

the sixth conductive segment is positioned at a fourth bonding surface of the third wafer; and the image sensor further comprises a layer of dielectric material positioned between the second and the third bonding surfaces.

* * * * *